(12) United States Patent
Beebe et al.

(10) Patent No.: US 7,111,635 B2
(45) Date of Patent: Sep. 26, 2006

(54) METHOD OF FABRICATING A FLOW CONSTRICTION WITHIN A CHANNEL OF A MICROFLUIDIC DEVICE

(75) Inventors: David J. Beebe, Madison, WI (US); Jeffrey S. Moore, Savory, IL (US); Jaisree Moorthy, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 225 days.

(21) Appl. No.: 10/269,476

(22) Filed: Oct. 11, 2002

(65) Prior Publication Data

US 2003/0136451 A1    Jul. 24, 2003

Related U.S. Application Data

(60) Provisional application No. 60/328,543, filed on Oct. 11, 2001.

(51) Int. Cl.
*F17D 1/18*    (2006.01)
*F15B 21/00*    (2006.01)

(52) U.S. Cl. .................. 137/14; 137/806; 137/827; 137/833; 251/368

(58) Field of Classification Search .......... 137/806, 137/807, 827, 833, 14; 251/368
See application file for complete search history.

(56) References Cited

U.S. PATENT DOCUMENTS

| | | | | |
|---|---|---|---|---|
| 3,048,537 | A | * | 8/1962 | Pall et al. ................ 210/510.1 |
| 3,568,692 | A | * | 3/1971 | Metzger et al. ............. 137/827 |
| 5,453,185 | A | | 9/1995 | Frechet et al. ........... 210/198.2 |
| 5,593,729 | A | | 1/1997 | Frechet et al. .............. 427/337 |
| 5,633,290 | A | | 5/1997 | Frechet et al. ................ 521/54 |
| 5,728,457 | A | | 3/1998 | Frechet et al. ........... 428/310.5 |
| 5,965,237 | A | * | 10/1999 | Bruin et al. ................. 428/156 |
| 6,193,647 | B1 | * | 2/2001 | Beebe et al. ................... 600/33 |
| 6,210,570 | B1 | | 4/2001 | Holloway ................ 210/198.2 |
| 6,645,432 | B1 | * | 11/2003 | Anderson et al. ........... 422/100 |
| 6,887,384 | B1 | * | 5/2005 | Frechet et al. .............. 210/634 |

* cited by examiner

*Primary Examiner*—A. Michael Chambers
(74) *Attorney, Agent, or Firm*—Boyle Fredrickson Newholm Stein & Gratz S.C.

(57) ABSTRACT

A method is provided for fabricating a constriction region in a channel of a microfluidic device. The method includes the steps of introducing a pre-polymer mixture including a monomer, cross-linking agent and photoinitiator into the channel. The pre-polymer mixture is polymerized at a localized area of the channel so as to shrink and solidify the liquid mixture. The solidified and shrunken liquid mixture provides the constriction region in the channel.

19 Claims, 6 Drawing Sheets

METHOD OF FABRICATING A FLOW CONSTRICTION WITHIN A CHANNEL OF A MICROFLUIDIC DEVICE

CROSS-REFERENCE TO RELATED APPLICATIONS

This application claims the benefit of U.S. Provisional Application Ser. No. 60/328,543, filed Oct. 11, 2001.

REFERENCE TO GOVERNMENT GRANT

This invention was made with United States government support awarded by the following agencies: DOD AF30602-00-2-0570. The United States has certain rights in this application.

FIELD OF THE INVENTION

This invention relates generally to microfluidic devices, and in particular, to a method of fabricating a flow constriction within a channel of a microfluidic device.

BACKGROUND AND SUMMARY OF THE INVENTION

As is known, microfluidic systems are being used in an increasing number of applications, including biological applications. In such biological applications, it is often a necessary function to "hold" a cell or other biological object (e.g. ova, embryo, etc.) at a known physical location within the microfluidic device in order to perform some type of manipulation of that object. Because of the scale of the biological objects of interest (microns), constriction regions intended to hold such biological objects at user desired locations within the microfluidic devices during manipulation must be provided. These constriction regions are formed in prior microfluidic devices by means of traditional lithographic-based, microfabrication methods that involve etching. However, these traditional methods are inherently expensive due to the equipment, materials and process complexity issues required.

By way of example, Beebe et al., U.S. Pat. No. 6,193,647 discloses a microfluidic embryo handling device. The microfluidic device provided in the Beebe et al., '647 patent includes channels therethrough that incorporate various types of constriction regions for accurately positioning individual biological objects within the microfluidic device. The channels and the constriction regions formed therein are fabricated within the microfluidic device utilizing any suitable micromachining technique. The constriction regions may be formed by providing an obstruction in the bottom surface of the channel and sealing the channel of the microfluidic device with a cover. Alternatively, the sidewall portions of the channel of the microfluidic device may be constricted at a desired location to prevent passage of biological objects therethrough. In order for any microfluidic device to function properly, it is necessary that the constriction regions within the channels to be partially open such that the fluid carrying the biological objects may pass over the biological objects positioned at the constriction regions. In addition, it is preferred that each constriction region be sized so as to prevent the corresponding biological object from flowing therepast and to prevent an increase in pressure of the fluid used in the microfluidic device to move the biological object.

It can be appreciated that the shapes of the constrictions regions may take different forms, as long as, such shapes prevent passage of the biological object while simultaneously allowing fluid to flow through the constriction regions. However, these different forms of the constriction regions may require different manufacturing techniques. By way of example, "narrow" constriction regions within the channels of a microfluidic device are fabricated using a single mask and etching operation. Alternatively, shallow constriction regions within the channels of a microfluidic device are fabricated using two masks and two etching operations. Each of these masking and etching operations necessary to fabricate the constriction regions in the channels of a microfluidic device are complex and require specialized equipment. As such, the overall cost of manufacturing a microfluidic device can be significant.

As the use of microfluidic devices for bioproduction (e.g. protein production, assisted reproduction, etc.) grows, it has become highly desirable to provide an inexpensive method of manufacturing various types of constriction regions within corresponding channels of a microfluidic device. If the manufacturing costs of microfluidic devices are reduced sufficiently, widespread use of microfluidic devices for such applications as incubation/maturation, infection, fertilization and/or chemical treatments of biological objects may become economically feasible.

Therefore, it is a primary object and feature of the present invention to provide a method of constructing a constriction region within a channel of a microfluidic device which is simple and inexpensive.

It is a further object and feature of the present invention to provide a method of constructing a constriction region within a channel of a microfluidic device which is capable to holding single cells or embryos at a known location within the microfluidic device.

It is a still further object and feature of the present invention to provide a method of constructing a constriction region within a channel of a microfluidic device which facilitates the speedy manufacture of such devices.

In accordance with the present invention, a method is disclosed for providing an obstruction in a channel of a microfluidic device. The channel has an input and an output for allowing the flow of fluid therethrough. The method includes the steps of providing a liquid mixture within the channel and solidifying the liquid mixture in the channel so as to form the obstruction.

The liquid mixture is a pre-polymer mixture and the step of solidifying the liquid mixture includes polymerizing the pre-polymer mixture. The liquid mixture is polymerized by being exposed to ultraviolet light. The ultraviolet light is generated with a source and is passed through an optical mask prior to polymerizing the pre-polymer mixture.

It is contemplated to add non-shrinkable material to the liquid mixture prior to solidifying the liquid mixture. The non-shrinkable material limits the shrinkage of the liquid mixture during solidification. In addition, the liquid mixture may also include a monomer, a cross-linking agent, and a photoinitiator.

In accordance with a further aspect of the present invention, a method is disclosed for providing an obstruction in a channel of a microfluidic device. A pre-polymer mixture is provided in the channel and exposed to a polymerizable stimulus such as an ultraviolet light from a source. The pre-polymer mixture shrinks and solidifies to form the obstruction in the channel.

It is contemplated to add non-shrinkable filler to the pre-polymer mixture prior to exposing the pre-polymer mixture to the ultraviolet source. The non-shrinkable filler modulates the shrinkage of the pre-polymer mixture. By way of example, the non-shrinkable filler may be glass beads. In order to expose the pre-polymer mixture to ultraviolet light, the ultraviolet light is generated by a source and passed through an optical mask. Thereafter, the pre-polymer mixture is exposed to the ultraviolet light. The pre-polymer mixture may include a monomer, a cross-linking agent and photoinitiator.

In accordance with a further aspect of the present invention, a method is provided for manufacturing a constriction region in a microfluidic device having a channel extending therethrough. The method includes the steps of introducing a liquid mixture including a monomer, cross-linking agent, and a photoinitiator into the channel. The liquid mixture is polymerized at a localized area within the channel so as to shrink the liquid material and provide an obstruction in the channel.

In order to polymerize the mixture, the liquid mixture is exposed to ultraviolet light. The ultraviolet light is generated with a source and passed through an optical mask. Non-shrinkable filler may be added to the liquid mixture prior to exposing the liquid mixture to the ultraviolet source. By adding non-shrinkable filler to the liquid mixture, the shrinkage of the liquid mixture is modulated such that the liquid mixture shrinks to a predetermined volumetric fraction of its original volume. By way of example, the non-shrinkable filler may be formed of glass beads.

BRIEF DESCRIPTION OF THE DRAWINGS

The drawings furnished herewith illustrate a preferred construction of the present invention in which the above advantages and features are clearly disclosed as well as others which will be readily understood from the following description of the illustrated embodiment.

In the drawings.

DETAILED DESCRIPTION OF THE DRAWINGS

Figure 1:
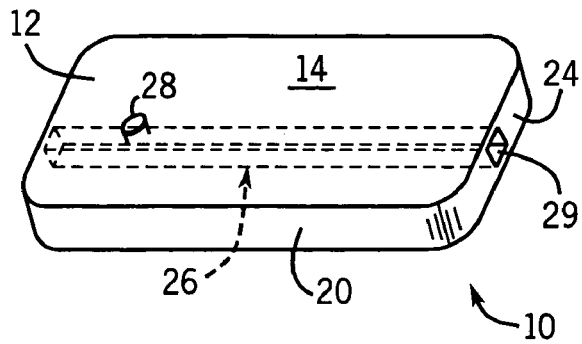
FIG. 1 is an isometric view of a microfluidic device having a channel extending therethrough.
Figure 2:
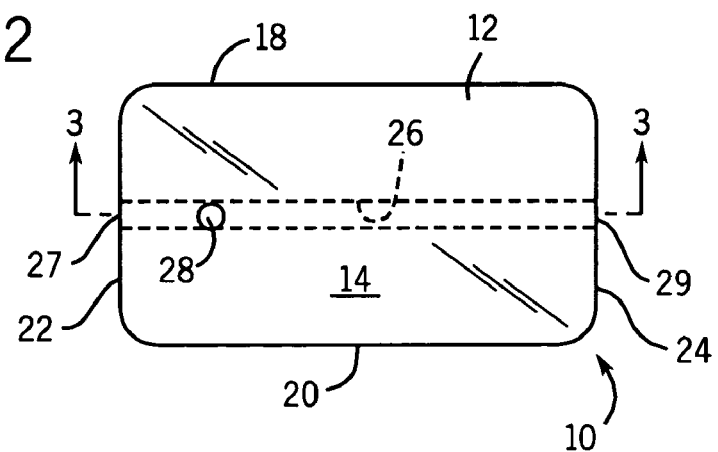
FIG. 2 is a top plan view of the microfluidic device of FIG. 1.
Figure 3:
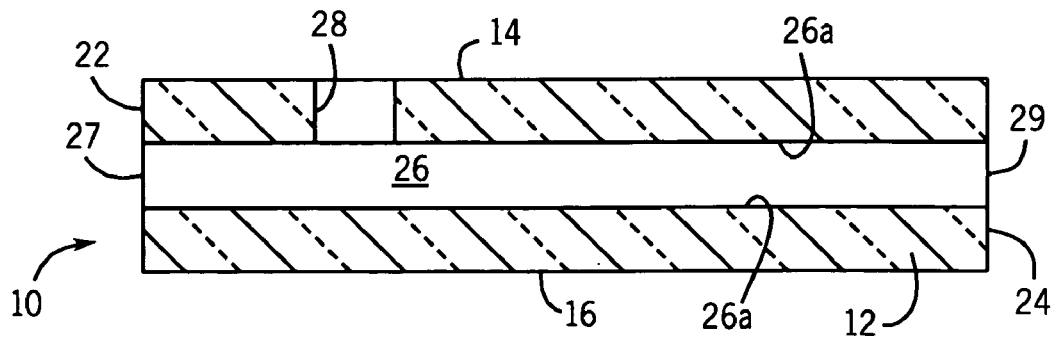
FIG. 3 is a cross-sectional view of the microfluidic device taken along line 3—3 of FIG. 2.
Figure 4:
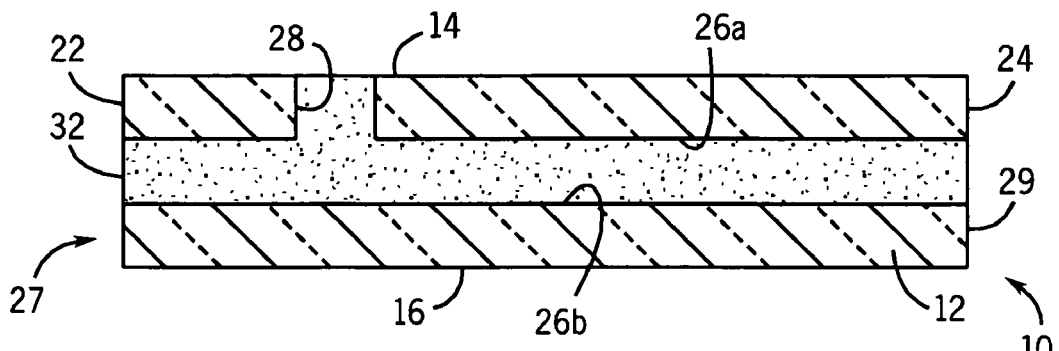
FIG. 4 is a cross-sectional view, similar to FIG. 3, showing a pre-polymer mixture within the channel of the microfluidic device.
Figure 5:
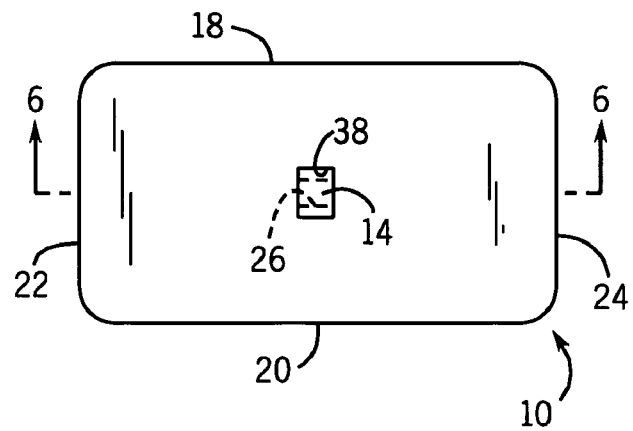
FIG. 5 is a top plan view of the microfluidic device of FIG. 1 having an optical mask affixed to the upper surface thereof.
Figure 6:
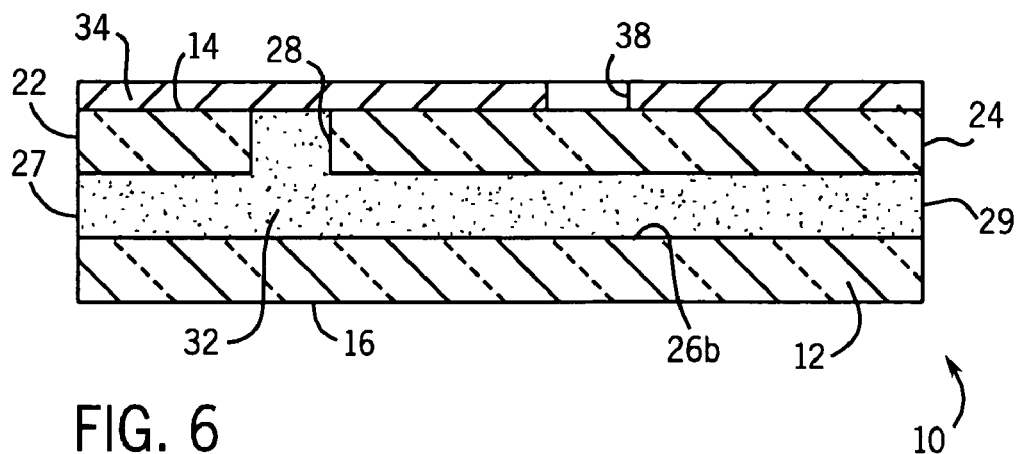
FIG. 6 is a cross-sectional view of the microfluidic device taken along line 6—6 of FIG. 5.
Figure 9:
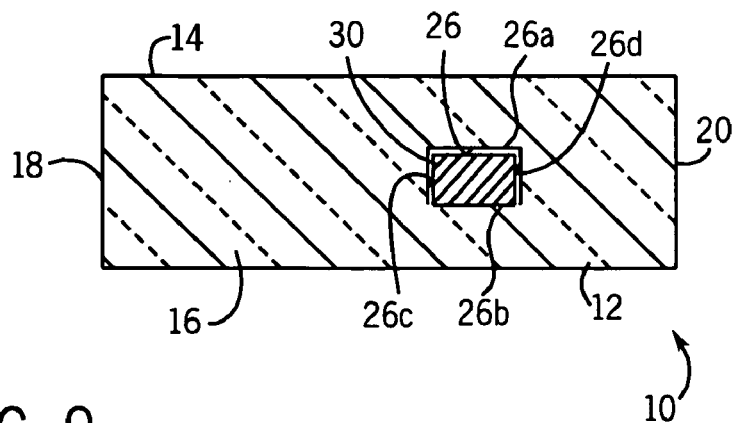
FIG. 9 is a cross-sectional view of the microfluidic device taken along line 9—9 of FIG. 8.

Referring to FIGS. 1–2, a microfluidic device is generally designated by the reference numeral 10. Microfluidic device 10 includes body 12 having upper and lower surfaces 14 and 16, FIG. 3, interconnected by first and second sidewalls 18 and 20, respectively, and by first and second end walls 22 and 24, respectively. Channel 26 extends longitudinally through body 12 between first and second ends 22 and 24, respectively, thereof, and includes an input 27 and an output 29 for accommodating the flow of fluid through microfluidic device 10. As best seen in FIG. 9, channel 26 is defined by upper and lower walls 26a and 26b, respectively, and sides 26c and 26d formed within body 12 of microfluidic device 10. Opening 28 extends through body 12 between channel 26 and upper surface 14 thereof so as to allow channel 26 to communicate with the ambient air outside of body 12.

Figure 8:
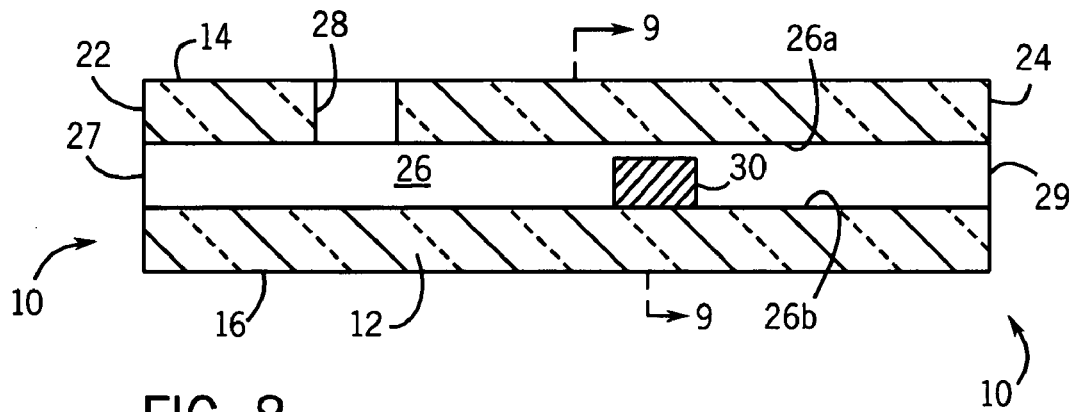
FIG. 8 is a cross-sectional view of a microfluidic device incorporating a flow constriction fabricated according to the method of the present invention.
Figure 10:
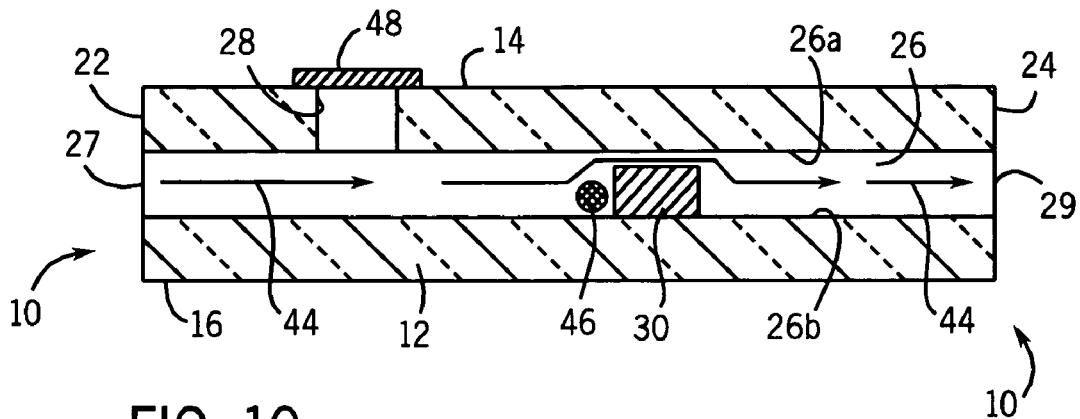
FIG. 10 is a cross-sectional view, similar to FIG. 8, showing the microfluidic device in use.

Referring to FIGS. 3–6, in order to form a flow constriction 30 within channel 26, FIGS. 8–10, pre-polymer mixture 32 is injected into channel 26 through opening 28 in body 12. It is contemplated that pre-polymer mixture 32 includes a monomer, a cross-linker and a photoinitiator, however, other compositions are possible without deviating from the scope of the present invention. Thereafter, optional mask 34 is affixed to upper surface 14 of body 12. Optional mask 34 includes an opening 38 therein corresponding to the desired shape and location of the flow constriction 30 to be formed in channel 36.

Figure 7:
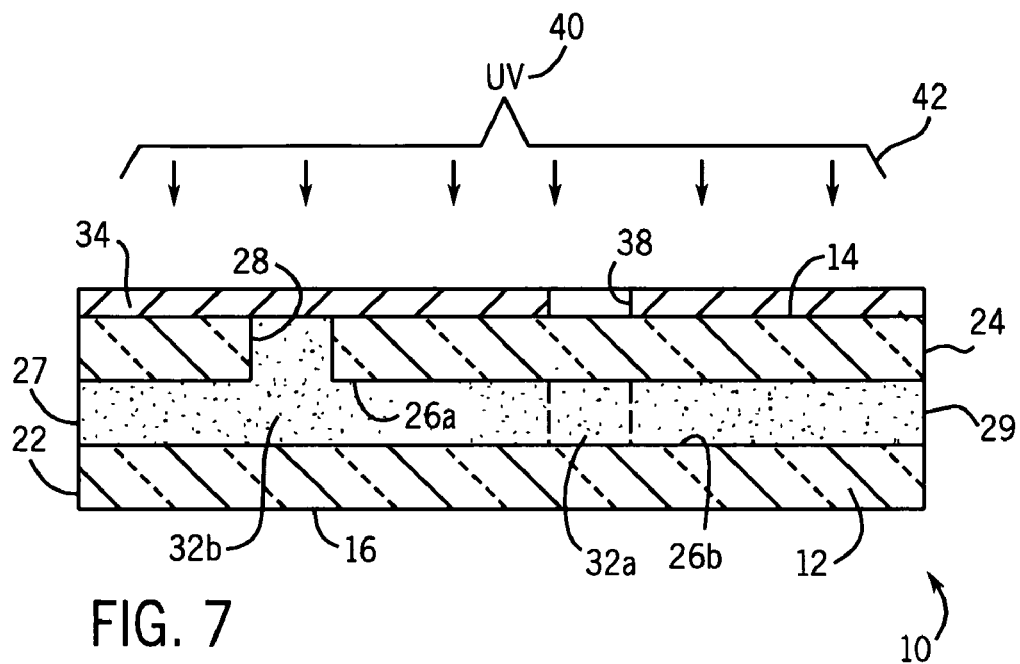
FIG. 7 is a cross-sectional view, similar to FIG. 6, showing polymerization of a portion of the pre-polymer mixture within the channel of the microfluidic device.

Referring to FIG. 7, a polymerizable stimulus such as temperature or an ultraviolet source 40 positioned above upper surface 14 of body 12 is provided. Ultraviolet source 40 generates ultraviolet light, generally designated by the reference numeral 42, which is directed towards microfluidic device 10 at an angle generally perpendicular to upper surface 14 of body 12. It can be appreciated that a first portion 32a of the pre-polymer mixture is exposed to the ultraviolet light 42 generated by ultraviolet source 40, while a second portion 32b of the pre-polymer mixture is shielded from the ultraviolet light generated by the ultraviolet source by optical mask 34.

As is known, exposed portion 32a of pre-polymer mixture 32 polymerizes and solidifies when exposed to the ultraviolet light 42 generated by the ultraviolet source 40. During polymerization, the exposed portion 32a of the pre-polymer mixture 32 shrinks by a predetermined amount. This shrinkage results in a delamination of the exposed portion 32a of the pre-polymer mixture 32 from upper wall 26a and sides 26c and 26d of channel 26. It can be appreciated that the shrinkage of the exposed portion 32a of pre-polymer mixture 32 is repeatable for a given polymer chemistry and given process conditions. In order to modulate the amount of shrinkage, it is contemplated to provide a non-shrinking material, such as glass beads, to the pre-polymer mixture 32 prior to the injection of the pre-polymer mixture 32 into channel 26. Consequently, the volume of the pre-polymer mixture 32 that is shrinkable can be controlled, and hence, the percentage of shrinkage of pre-polymer mixture 32 can be controlled. Alternatively, the non-shrinking material may take the form of a prefabricated filter, tissue scaffold material, an electrode or the like. The non-shrinking material may be set in position within channel 26 or injected into channel 26 with pre-polymer mixture 32 to a desired position. Once the exposed portion 32a of pre-polymer mixture 32 is polymerized and solidified, such portion 32a of pre-polymer mixture 32 retains the non-shrinking material in position within channel 26.

As best seen in FIGS. 8–9, once the exposed portion 32a of pre-polymer mixture 32 is polymerized and solidified, such portion 32a of pre-polymer mixture 32 takes the form of an obstruction or flow constriction 30 within channel 26. The location of flow constriction 30 is determined by the location of opening 38 in optical mask 34. Thereafter, optical mask 34 is removed from upper surface 14 of body 12 and the portion 32b of pre-polymer mixture 32, FIG. 7, not exposed to ultraviolet light 42 generated by ultraviolet source 40 is flushed from channel 26.

Referring to FIG. 10, in operation, biological fluid medium, depicted by arrows 44, is provided at input 27 to channel 26 of microfluidic device 10. It is intended that fluid medium 44 include a biological object 46 such as an ova, embryo or the like. Biological object 46 continues to flow through channel 26 until such point as biological object 46 engages flow constriction 30 formed in channel 26 as heretofore described. Thereafter, biological object 46 remains positioned at a predetermined location adjacent flow constriction 30 within channel 26 so as to allow manipulation of biological object 46 as heretofore described. The fluid medium 44 continues to flow past flow constriction 30 in channel 26 through the gap between flow constriction 30 and top wall 26a of channel 26, as well as, the gaps between flow constriction 30 and sides 26c and 26d of channel 26. Fluid medium 44 which flows past flow constriction 30 in channel 26 exits channel 26 through output 29 in microfluidic device 10. Biological object 46 may be freed from its position adjacent flow constriction 30 by simply reversing the flow of fluid medium 44 through channel 26. In order to maintain the flow of fluid medium 44 within channel 26, a cover 48 may be affixed to upper surface 14 of body 12. Cover 48 overlaps opening 28 through body 12 so as to prevent the flow of biological medium 44 and/or biological object 46 therethrough.

It is contemplated that channel networks having different configurations may be fabricated within microfluidic device 10 in any conventional manner. In addition, it can be appreciated that flow constriction 30 within channel 26 can be of any shape so long as flow constriction 30 prevents passage of biological object 46 while simultaneously allowing fluid to flow therepast. The flow constrictions 30 of different configurations may be fabricated within such channel networks of microfluidic device 10 using the method heretofore described and simply varying the configurations of the optical masks. Additional structures such as supports for maintaining the position of flow constriction 30 during use of microfluidic device 10 may also be fabricated using the method heretofore described. Further, it is intended that the use of microfluidic device 10 described herein not be limited to biological applications. It can be appreciated that microfluidic device 10 having flow constriction 30 formed therein in accordance with the method of the present invention may be used in other types of applications without deviating from the scope of the present invention.

Figure 11:
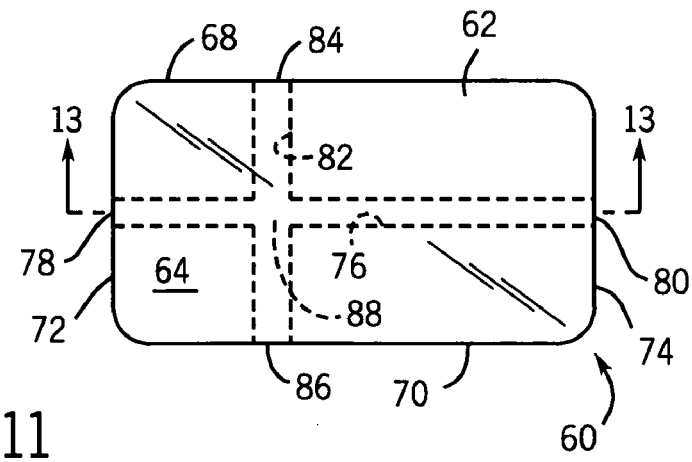
FIG. 11 is a top plan view of an alternate embodiment of a microfluidic device.

Referring to FIG. 11, an alternate microfluidic device for use in practicing the method of the present invention is generally designated by the reference numeral 60. Microfluidic device 60 includes body 62 having upper and lower surfaces 64 and 66, FIG. 13, interconnected by first and second sidewalls 68 and 70, respectively, and by first and second end walls 72 and 74, respectively. First channel 76 extends longitudinally through body 62 between first and second end walls 72 and 74, respectively, thereof, and includes an input 78 and an output 80 for allowing the flow of fluid through microfluidic device 60. Second channel 82 extends along an axis of transverse to the longitudinal axis of body 62 between first and second sidewalls 68 and 70, respectively, thereof. Second channel 82 includes an input 84 and an output 86 for allowing the flow of fluid through microfluidic device 60. First channel 76 and second channel 82 intersect and communicate with each other at an intersection region 88, for reasons hereinafter described.

Figure 12:
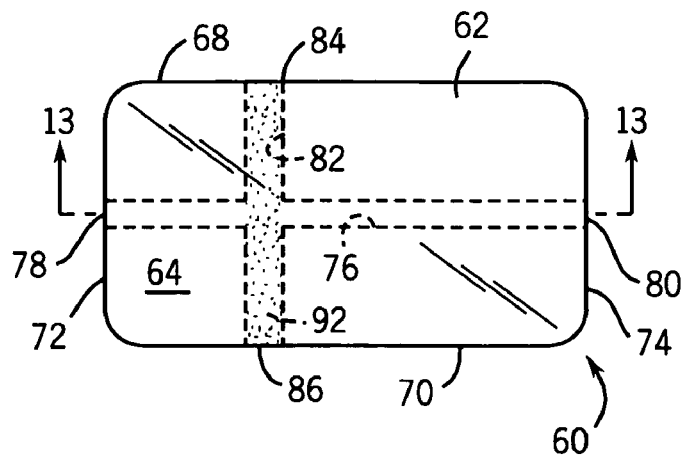
FIG. 12 is a top plan view of the microfluidic device of FIG. 11 showing a pre-polymer mixture within a first channel of the microfluidic device.
Figure 13:
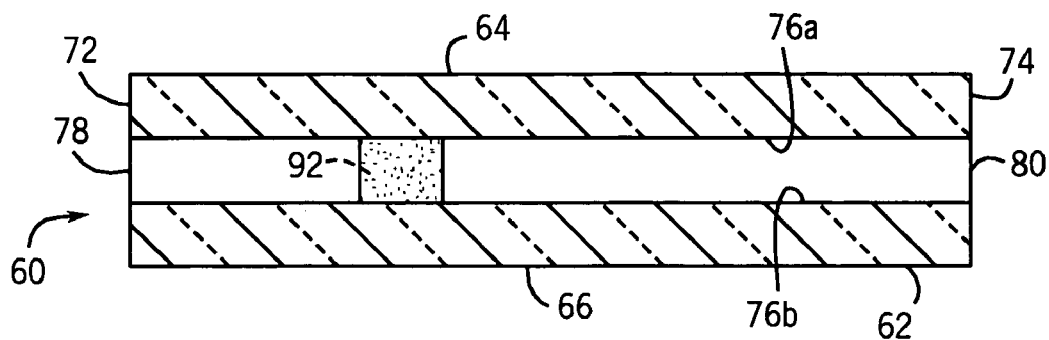
FIG. 13 is a cross-sectional view of the microfluidic device taken along line 13—13 of FIG. 12.
Figure 17:
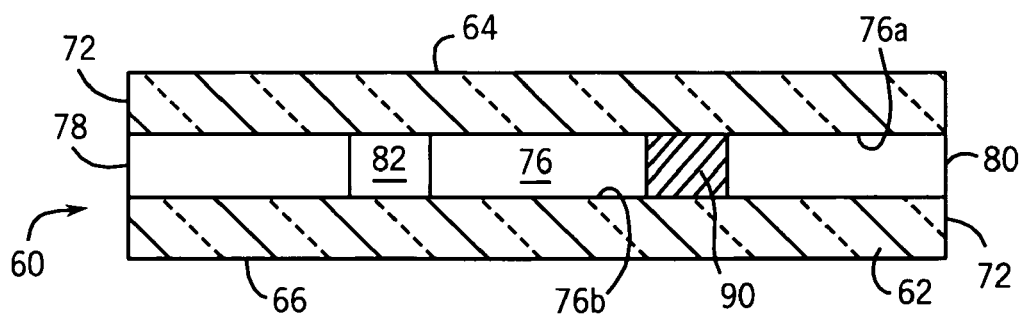
FIG. 17 is a cross-sectional view, similar to FIG. 16, showing the microfluidic device incorporating a flow constriction fabricated according to the method of the present invention.

Referring to FIGS. 12–13, in order to form a flow constriction 90 within first channel 76, FIG. 17, pre-polymer mixture 92 is injected into second channel 82 through input 84 thereof. It is contemplated that pre-polymer mixture 92 include a polymer, a cross-linker, and a photoinitiator. However, other compositions are possible without deviating from the scope of the present invention.

Figure 14:
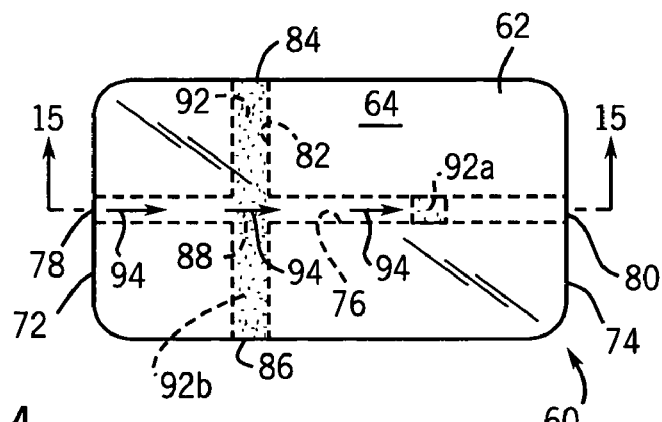
FIG. 14 is a top plan view, similar to FIG. 12, showing a portion of the pre-polymer mixture repositioned within a second channel of the microfluidic device.
Figure 15:
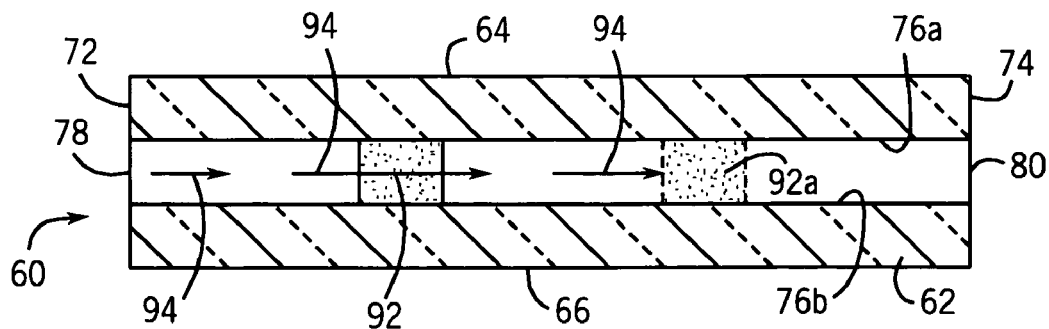
FIG. 15 is a cross-sectional view of the microfluidic device taken along line 15—15 of FIG. 14.

Referring to FIGS. 14 and 15, an inert fluid medium, depicted by arrows 94, is provided at input 78 to first channel 76 of microfluidic device 60. It is intended that fluid medium 94 urge a portion 92a of the pre-polymer mixture 92 from the intersection region 88 of first and second channels 76 and 82, respectively, to a user desired location within first channel 76 of microfluidic device 60. It can be appreciated that other mechanisms, such as a vacuum at output 80 of first channel 76, may be used instead of fluid medium 94 to move portion 92a of pre-polymer mixture 92 from intersection region 88 of first and second channels 76 and 82, respectively, to the predetermined location within first channel 76.

Figure 16:
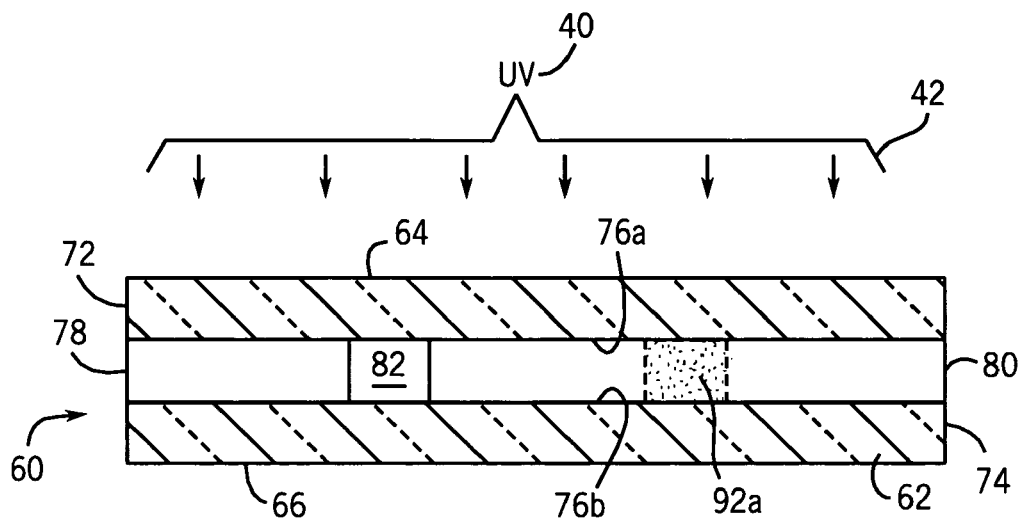
FIG. 16 is a cross-sectional view, similar to FIG. 15, showing polymerization of the portion of the pre-polymer mixture within the second channel of the microfluidic device.

Referring to FIG. 16, the portion 92b of the pre-polymer mixture 92 remaining in second channel 82 after portion 92a of the pre-polymer mixture 92 has been moved to a predetermined location within first channel 76 is flushed from second channel 82. Ultraviolet source 40 is positioned above upper surface 64 of body 62. Ultraviolet source 40 generates ultraviolet light, generally designated by the reference numeral 42, which is directed towards microfluidic device 60 at an angle perpendicular to upper surface 64 of body 62 so as to expose portion 92a of prepolymer mixture 92 within first channel 76 to ultraviolet light 42. Exposed portion 92a of pre-polymer mixture 92 polymerizes and solidifies when exposed to ultraviolet light 42 generated by ultraviolet source 40. As heretofore described, exposed portion 92a of pre-polymer mixture 92 shrinks by a predetermined amount so as to take the form of an obstruction or flow constriction 90 within first channel 76, FIG. 17.

Alternatively, a flow constriction or post 90 may be formed within first channel 76 of microfluidic device 60. Post 90 is formed by phase separation photo-polymerization of pre-polymer mixture 92. In such application, pre-polymer mixture 92 includes a monomer, a porogen (e.g. water, salts), a cross-linker and a photoinitiator. Two immiscible phases are agitated to create droplets of one phase suspended in the second phase. Photo-polymerization of one phase results in the formation of polymer particles that subsequently join together. Upon further processing (e.g. drying to remove water), the porogen is removed to give a contiguous polymer particles network surrounded by interconnected passageways or, in other words, post 90. The size, distribution of passageways and the mechanical properties of post 90 are dependent on a number of factors including monomer and water concentration, the cross-linkers and the photoinitiator concentration. This gives a large parameter space for tuning the filtering properties of post 90 for various applications.

Further, it has been found that when post 90 is dry, fluid can flow easily through post 90. However, over a period of time, the polymer beads (that constitute post 90) swell and the pressure drop across post 90 increases. This, in turn, decreases the ease at which the fluid flows post 90. This functionality can be utilized to develop a 'timer' seal or flow controller unit in channel 76 of microfluidic device 60, whereby channel 76 can be closed to prevent back-flow and/or contamination after a certain period of time. By changing the composition of pre-polymer mixture 92, it is possible to change the length of time before the seal is effective.

Both methods heretofore described (shrinkage and porous material) are fabricated photochemically, which allows for the flow constrictions 90 to be placed anywhere in the first channel 76. While the flow of fluid is constricted to a single straight channel in the shrinkage method, it can be appreciated that post 90 has multiple tortuous passageways therethrough. As such, post 90 within first channel 76 has the ability to filter particles flowing through first channel 76 based on size. In addition, post 90 in first channel 76 has the ability to hold objects or particles within first channel 76 at a user desired location and the large surface area of post 90 can be used for carrying out surface related analysis; for example, Enzyme Linked Immunosorbent Assay (ELISA). By choosing an appropriate composition of monomer, cross-linker, photoinitiator and porogen, the size of the passageways (less than 1 µm to 150 µm) and the distribution can be modified as desired by a user.

Further, as is known, the mixing of two or more flow streams inside the channels of a microfluidic device occurs mainly by diffusion. The extent of mixing of the two or more flow streams varies with the length of the channel. This property may be used for varying the composition of post 90. Since the sizes of the passageways through post 90 in first channel 76 change with the composition of pre-polymer mixture 92, a post 90 having gradient in passageway size can be fabricated inside first channel 76. As a result, post 90 within first channel 76 may be used to do multiple separations of objects or particles within such channel. For example, for a given polymer chemistry and given process conditions, post 90 may sequentially filter out objects or particles of smaller dimensions as such objects or particles flow therethrough.

It can be appreciated that the method of the present invention heretofore described may be repeated such that multiple flow constrictions may be fabricated with channel 26 of microfluidic device 10. Alternatively, a user may repeat the method of the present invention to fabricate a second flow constriction adjacent or interconnected to previously fabricated flow constriction in order to increase the dimensions of the previously fabricated flow constriction within channel 26.

Various modes of carrying out the invention are contemplated as being within the scope of the following claims particularly pointing out and distinctly claiming the subject matter which is regarded as the invention.

We claim:

1. A method of providing an obstruction having a configuration in a microfluidic device having a channel extending therethrough, the channel having an input and output for allowing the flow of fluid therethrough, comprising the steps of:
   providing a liquid mixture within the channel;
   adding filler material to the liquid mixture; and
   solidifying the liquid mixture in the channel to provide the obstruction;
   wherein the filler material modulates the configuration of the obstruction as the liquid mixture is solidified.

2. The method of claim 1 wherein the liquid mixture is a pre-polymer mixture and wherein the step of solidifying the liquid mixture includes polymerizing the pre-polymer mixture.

3. The method of claim 1 wherein the step of solidifying the liquid mixture includes the step of exposing the liquid mixture to ultraviolet light.

4. A method of providing an obstruction in a microfluidic device having a channel extending therethrough, comprising the steps of:
   providing a pre-polymer mixture in the channel;
   exposing the pre-polymer mixture to a polymerizable stimulus from a source such that the pre-polymer mixture shrinks and solidifies to provide the obstruction in the channel; and
   adding filler to the pre-polymer mixture prior to exposing the pre-polymer mixture to the polymerizable simulus to modulate the shrinkage of the pre-polymer mixture.

5. The method of claim 4 wherein the pre-polymer shrinks a predetermined volumetric fraction.

6. The method of claim 4 wherein the filler is glass beads.

7. The method of claim 4 wherein the step of exposing the pre-polymer mixture to a polymerizable stimulus includes the additional steps of:
   generating the ultraviolet light with the source; and
   passing the ultraviolet light through an optical mask.

8. The method of claim 4 wherein the pre-polymer mixture includes a monomer, a cross-linking agent and a photoinitiator.

9. A method of manufacturing a constriction region in a microfluidic device having a channel extending therethrough, comprising the steps of:
   introducing a liquid mix;
   polymerizing the liquid mixture at a localized area of the channel so as to shrink the liquid mixture and provide an obstruction in the channel; and
   controlling the shrinkage of the liquid mixture during polymerization.

10. The method of claim 9 wherein the step of polymerizing the liquid mixture includes the step of exposing the liquid mixture to ultraviolet light.

11. The method of claim 10 wherein the step of exposing the liquid mixture to ultraviolet light includes the additional steps of:
    generating the ultraviolet light with a source; and
    passing the ultraviolet light through an optical mask.

12. The method of claim 10 wherein the step of controlling the liquid mixture includes the additional step of adding non-shrinkable filler to the liquid mixture prior to exposing the liquid mixture to the ultraviolet source to modulate the shrinkage of the liquid mixture.

13. The method of claim 12 wherein the non-shrinkable filler is glass beads.

14. The method of claim 9 wherein the step of controlling the liquid mixture includes the additional step of positioning non-shrinkable material within the channel prior to the step of polymerizing the liquid mixture.

15. The method of claim 9 wherein the liquid mixture shrinks to a predetermined volumetric fraction.

16. A method of providing an obstruction in a microfluidic device having a channel extending therethrough, the channel having an input and output for allowing the flow of fluid therethrough, comprising the steps of:
   providing a liquid mixture within the channel;
   positioning filler material within the channel; and
   solidifying the liquid mixture in the channel to provide the obstruction.

17. A method of providing an obstruction in a microfluidic device having a channel extending therethrough, the channel having an input and output for allowing the flow of fluid therethrough, comprising the steps of:
   providing a liquid mixture within the channel;
   adding filler material to the liquid mixture; and
   solidifying the liquid mixture in the channel to provide the obstructions by exposing the liquid mixture to ultraviolet light;
   wherein the step of exposing the liquid mixture to ultraviolet light includes the additional steps of:
      generating the ultraviolet light with a source; and
      passing the ultraviolet light through an optical mask.

18. A method of providing an obstruction in a microfluidic device having a channel extending therethrough, the channel having an input and output for allowing the flow of fluid therethrough, comprising the steps of:
   providing a liquid mixture within the channel;
   adding filler material to the liquid mixture; and
   solidifying the liquid mixture in the channel to provide the obstruction;
   wherein the step of solidifying the liquid mixture includes the step of shrinking the liquid mixture.

19. A method of providing an obstruction in a microfluidic device having a channel extending therethrough, the channel having an input and output for allowing the flow of fluid therethrough, comprising the steps of:
   providing a liquid mixture within the channel, the liquid mixture including a monomer, a cross-linking agent and a photoinitiator;
   adding filler material to the liquid mixture; and
   solidifying the liquid mixture in the channel to provide the obstruction.

* * * * *